US006362566B2

United States Patent
Xu et al.

(10) Patent No.: US 6,362,566 B2
(45) Date of Patent: *Mar. 26, 2002

(54) ORGANIC ELECTROLUMINESCENT APPARATUS

(75) Inventors: Ji-Hai Xu, Gilbert, AZ (US); Hsing-Chung Lee, Calabasas, CA (US); Song Q. Shi, Phoenix, AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/151,346

(22) Filed: Sep. 11, 1998

(51) Int. Cl.$^7$ .................................................. H01J 1/62
(52) U.S. Cl. ........................................ 313/501; 313/504
(58) Field of Search ................................. 313/498, 499, 313/500, 501, 502, 503, 504, 505, 506

(56) References Cited

U.S. PATENT DOCUMENTS

| | | | | |
|---|---|---|---|---|
| 5,315,129 A | * | 5/1994 | Forrest et al. | 257/21 |
| 5,405,710 A | * | 4/1995 | Dodabalapur et al. | 428/690 |
| 5,409,783 A | * | 4/1995 | Tang et al. | 428/690 |
| 5,478,658 A | * | 12/1995 | Dodabalapur et al. | 428/690 |
| 5,674,636 A | * | 10/1997 | Dodabalapur et al. | 428/690 |
| 5,814,416 A | * | 9/1998 | Dodabalapur et al. | 428/690 |
| 5,949,187 A | * | 9/1999 | Xu et al. | 313/504 |
| 6,140,764 A | * | 10/2000 | Xu et al. | 313/504 |

FOREIGN PATENT DOCUMENTS

| | | | | |
|---|---|---|---|---|
| EP | 0683623 | 11/1995 | | H05B/33/12 |
| WO | 0004594 | 1/2000 | | H01L/51/20 |

OTHER PUBLICATIONS

"Optical Processes in Microcavities," Yoshihisa Yamamoto et al, Physics Today, Jun. 1993, pp. 66–73.
"Physics and Device Applications of Optical Microcavities," H. Yokoyama, Science, vol. 256, Apr. 2, 1992, pp. 66–70.

* cited by examiner

*Primary Examiner*—Nimeshkumar D. Patel
*Assistant Examiner*—Mariceli Santiago
(74) *Attorney, Agent, or Firm*—William E. Koch; Eugene A. Parsons

(57) ABSTRACT

Organic electroluminescent apparatus including an organic electroluminescent device for emitting blue-green light. A microcavity structure receives the blue-green light and is tuned to a resonance such that the blue-green light is enhanced to blue and green light. A color converting medium receives and absorbs the blue-green light and emits red light in response thereto.

12 Claims, 2 Drawing Sheets

ORGANIC ELECTROLUMINESCENT APPARATUS

FIELD OF THE INVENTION

The present invention pertains to organic electroluminescent apparatus and more specifically to apparatus for enhancing conversion of blue light to red light.

BACKGROUND OF THE INVENTION

Light emitting diode (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices such as portable electronic devices.

Organic electroluminescent device (OED) arrays are emerging as a potentially viable design choice for use in small products, especially small portable electronic devices such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

A problem in the use of OEDs in displays is the generation of the colors necessary to achieve a full color display. Red, green and blue OEDs can be fabricated but they require different organic materials and, thus, each color must be fabricated separately. Furthermore, the colors achieved are not a pure primary color, but have a relatively broad spectrum. Emission of red light is very difficult to achieve in OEDs however, it is known to convert other colors, such as blue light, to red light. One such technique is disclosed in Japanese Publication, Kokai Patent No. Hei 8-286033 entitled "Red Emitting Device Using Red Fluorescent Converting Film", published Nov. 1, 1996. While converting blue light to red light, the efficiency of the conversion is unacceptably low, and the red light contains unacceptable levels of blue green components.

Accordingly, it is highly desirable to provide apparatus and a method of converting broad spectrum light to red light.

It is a purpose of the present invention to provide a new and improved apparatus and a method of generating red light.

It is a further purpose of the present invention to provide apparatus and a method of efficiently generating red light.

SUMMARY OF THE INVENTION

The above problems and others are at least partially solved and the above purposes and others are realized in organic electroluminescent apparatus including an organic electroluminescent device for emitting light having a broad spectrum. A color converting medium absorbs light coupled thereto and emits light in response to absorbed light. The color converting medium has first and second absorption peaks at first and second wavelengths and emits light at a third wavelength different than the first and second wavelengths. A microcavity structure is used to couple emitted light from the organic electroluminescent device to the color converting medium. The microcavity structure has a resonance such that the broad spectrum light received from the organic electroluminescent device is enhanced by the microcavity structure to enhanced light having first and second resonant peaks which substantially overlap the first and second absorption peaks, respectfully.

BRIEF DESCRIPTION OF THE DRAWINGS

Referring to the drawings.

DESCRIPTION OF THE PREFERRED EMBODIMENTS

Figure 1:
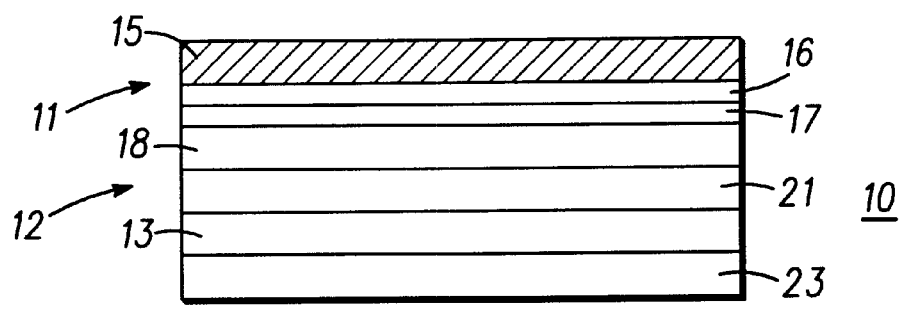
FIG. 1 is an enlarged and simplified sectional view of organic electroluminescent apparatus in accordance with the present invention.

Turning now to the figures, FIG. 1 is an enlarged and simplified sectional view of organic electroluminescent apparatus 10 in accordance with the present invention. Organic electroluminescent apparatus 10 includes an organic electroluminescent device (OED), generally designated 11 and a microcavity 12 carried by a transparent substrate 13, such as glass. Microcavity 12 is positioned in alignment with the light output from OED 11 to enhance the light spectrum.

In this embodiment, OED 11 includes an upper metal electrical contact 15, an electron transporting layer 16, a hole transporting layer 17 and a lower electrical contact 18. Upper electrical contact 15 essentially forms a reflective surface to reflect all light generated within OED 11 downwardly. Lower electrical contact 18 is formed of some electrically conductive material which is transparent to light generated in OED 11, such as indium-tin-oxide (ITO) or the like and communicate the OED light output to the remainder of apparatus 10. Electron transporting layer 16 and hole transporting layer 17 define an organic light emitting zone with either or both layers 16 and 17 emitting light in response to the recombination of holes and electrons therein. It will of course be understood that OED 11 could include from one organic layer to several, depending upon the material utilized.

Microcavity structure 12 is illustrated in FIG. 1 as including OED 11 and a mirror stack 21. Mirror stack 21 includes a plurality of layers of material having different indexes of refraction. The plurality of layers is divided into pairs of layers, one layer of each pair having a first index of refraction and another layer of each pair having a second index of refraction lower than the first index of refraction with each pair of layers cooperating to form a partial mirror and to reflect light. The plurality of layers can be formed from a variety of materials including various semi-transparent metals and various dielectrics. In a typical example, mirror stack 21 is preferably formed of, for example, alternate layers of $TiO_2$ and $SiO_2$. Generally, from 2 to 4 pairs of layers provides a reflectivity of approximately 0.74, which is believed to be optimal for the present purpose. As is understood by those skilled in the art, each pair of layers of mirror stack 21 defines a partial mirror with an operating thickness of an integer multiple of one half wavelength of the emitted light so that all reflected light is in phase.

The combined thickness of organic layers 16 and 17 and lower contact 18 is designed to position mirror stack 21 in spaced relationship from reflective upper contact 15 and define an optical length L1 of microcavity structure 12 in cooperation with the OED 11. Stack 21 further defines a light output for microcavity structure 12, and the optical length L1 of microcavity structure 12 is generally designed such that light emitted from the light output has resonant peaks as will be described presently.

A color converting medium (CCM) 23 is positioned on substrate 13 to receive enhanced light from microcavity structure 12. In this embodiment, CCM 23 is positioned on a surface of substrate 13 opposite microcavity structure 12. However, it will be understood that CCM 23 can be positioned between microcavity structure 12 and substrate 13. Recently it has been demonstrated (see Japanese publication cited above) that efficient RGB light emission can be achieved by combining an organic OED emitter with a CCM device, such as CCM 23. CCM 23 is made up of organic fluorescent media which change the color of emitted light from blue-green to blue, green or red. To achieve an efficient CCM device, a red fluorescent converting film is made by dispersing a first fluorescent pigment including, for example, rhodamine, and a second fluorescent pigment into a light transmitting medium. The first pigment has an absorption range from 450–610 nm and emits red light above 600 nm. The second pigment absorbs light in the blue region under 520 nm. By combining the first and second pigments, an efficient CCM film (CCM23) is provided which absorbs light as illustrated by absorption waveform 25 in FIG. 2.

Figure 2:
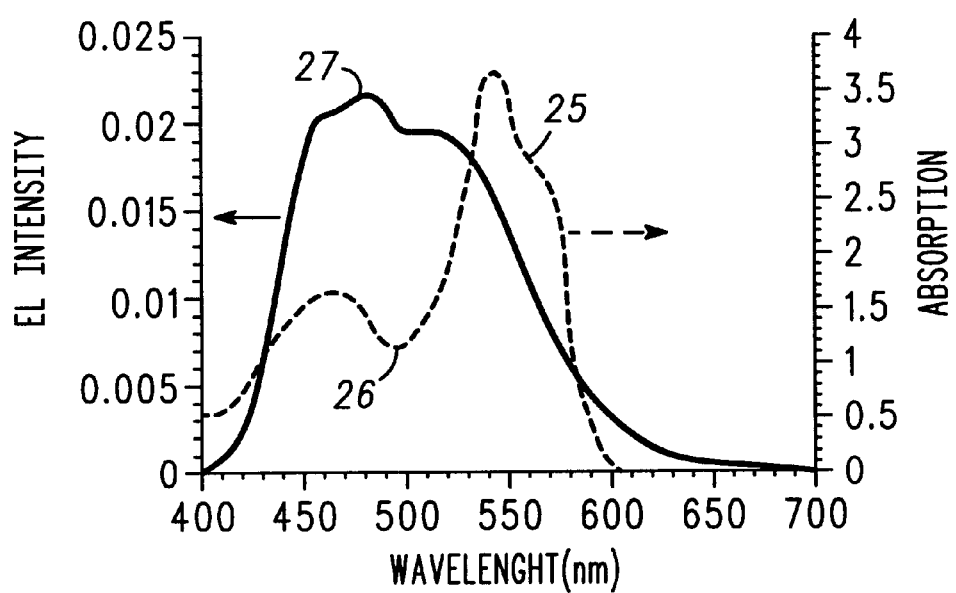
FIG. 2 is a graphical spectrum representation illustrating a broad spectrum light in relation to the absorption peaks of the color converting medium.

The light emitted from OED 11 is a broad spectrum light, for example in a blue-green spectrum as illustrated by waveform 27 in FIG. 2. It can be seen from FIG. 2, that the absorption of CCM 23 is not a uniform function of wavelengths, and there exists a valley 26 at approximately 490 nm. It should be noted that the blue-green spectrum emitted by OED 11 has a substantial portion overlying valley 26. As a result, without the inclusion of microcavity structure 12, CCM 23 would have to be very thick to absorb the light around 490 nm. Furthermore, if microcavity structure 12 were not employed, a small blue light spectrum component would remain around 490 nm even with a very thick CCM 23 reducing the quality of the emitted red light.

Figure 3:
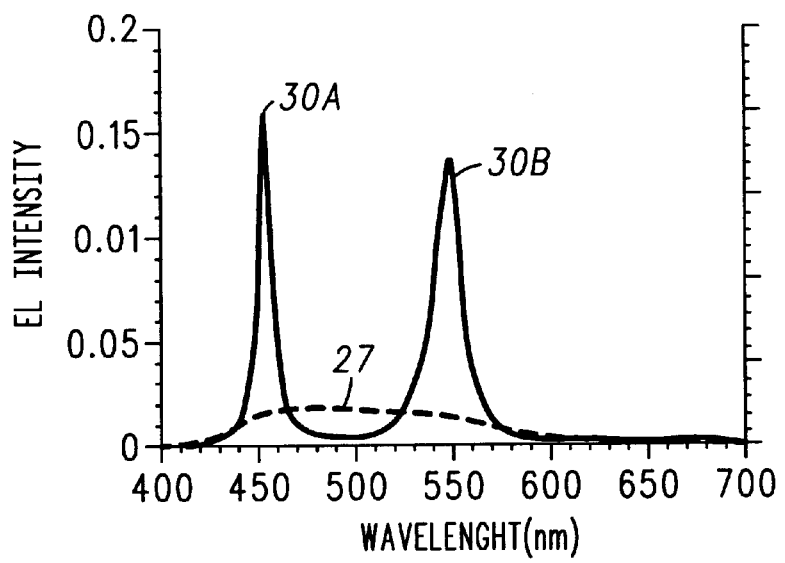
FIG. 3 is a graphical spectrum representation illustrating the enhancement of the broad spectrum light.
Figure 4:
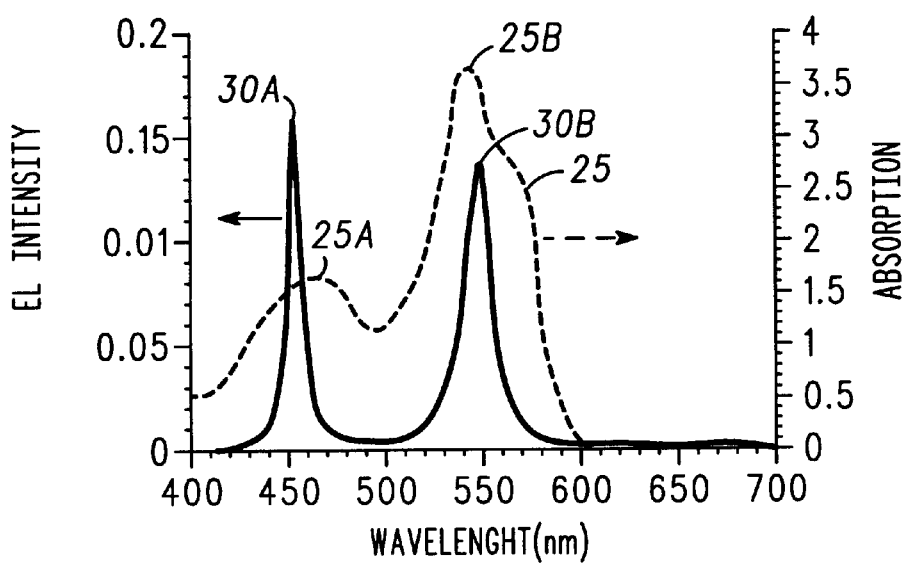
FIG. 4 is a graphical spectrum representation illustrating the enhanced broad spectrum light in relation to the absorption peaks of the color converting medium.

By employing microcavity structure 12, the blue-green spectrum emitted by OED 11 is enhanced to resonant peaks as represented by waveforms 30A and 30B in FIG. 3, thus giving rise to saturated blue and green colors. This leads to much brighter blue and green colors (2 enhancement) when CCM 23 is used. The scale of FIG. 3 has been expanded to accommodate waveforms 30A and 30B, and waveform 27. As can be seen by comparing waveform 27 with waveforms 30A and 30B, the intensity of the emitted light represented by waveform 27 has been greatly increased at approximately 450 nm and 540 nm, and the component at 490 nm has been greatly reduced. With reference to FIG. 4, by tuning microcavity structure 12 resonance to wavelengths near the absorption peaks (about 450 nm and about 540 nm) of CCM 23, the absorption of blue-green colors can be maximized, which results in a maximum blue-green to red conversion efficiency. The broad spectrum light represented by waveform 25 is enhanced to resonant peaks represented by waveforms 30A and 30B which overlap absorption peaks 25A and 25B of waveform 25 at approximately 450 nm and 540 nm. Thus all of the enhanced light from microcavity structure 12 is absorbed by CCM 23 and pure red light is emitted. The component of the broad spectrum light emitted by OED 11 corresponding to valley 26 has been shifted by enhancement to an absorbable wavelength (e.g. 450 nm), increasing the light absorbed by the CCM and eliminating small spectrum components produced when microcavity structure 12 is absent. Thus, efficiency is improved while improving the purity of the light emitted, and by the combination microcavity 12 with CCM 23, it is possible to achieve a higher color-conversion efficiency for blue-green to red, and a brighter RGB display can be readily built based on this approach.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. Organic electroluminescent apparatus comprising:
   a substrate having a first surface and a second surface;
   an organic electroluminescent device for emitting light having a broad spectrum;
   a color converting medium layer disposed on the first surface of the substrate for absorbing light coupled thereto and emitting light in response to absorbed light, the color converting medium layer having absorption peaks at a first wavelength and a second wavelength and emitting light at a third wavelength different than the first and second wavelengths; and
   a microcavity structure disposed on the second surface of the substrate coupling emitted light from the organic electroluminescent device to the color converting medium layer, the microcavity structure having a resonance such that light emitted having a broad spectrum is enhanced by the microcavity structure to light having a first resonant peak which substantially overlaps one of the first and second absorption peaks and a second resonant peak which substantially overlaps the other one of the first and second absorption peaks.

2. Organic electroluminescent apparatus as claimed in claim 1 wherein the organic electroluminescent device is constructed to emit light in a blue-green spectrum.

3. Organic electroluminescent apparatus as claimed in claim 2 wherein the color converting medium is constructed with the first and second absorption peaks substantially in a blue-green spectrum.

4. Organic electroluminescent apparatus as claimed in claim 3 wherein the color converting medium is constructed with the light emitting wavelength substantially at a red spectrum.

5. Organic electroluminescent apparatus as claimed in claim 1 wherein the microcavity structure includes a resonance tuned near the first and second absorption peaks of the color converting medium.

6. Organic electroluminescent apparatus comprising:
   a transparent substrate having a first surface and a second surface;

an organic electroluminescent device for emitting blue-green light;

a single microcavity structure positioned on the second surface of the transparent substrate to receive the blue-green light from the organic electroluminescent device, the microcavity structure having a resonance such that the blue-green light is enhanced by the microcavity structure to substantially blue and green light; and a color converting medium layer positioned on the first surface of the transparent substrate and coupled to receive the substantially blue and green light from the microcavity structure for absorbing the substantially blue and green light and emitting substantially red light in response thereto.

7. A method of converting light having first and second wavelengths to light having a third wavelength comprising the steps of:

providing a substrate having a first surface and a second surface;

providing an organic electroluminescent device for emitting light having a broad spectrum;

providing a color converting medium layer formed on the second surface of the substrate and having a first absorption peak at a first wavelength and a second absorption peak at a second wavelength;

providing a single microcavity structure positioned to receive and enhance the light from the organic electroluminescent device;

enhancing the broad spectrum light emitted from the organic electroluminescent device to light having a first resonant peak which substantially overlaps the first absorption peak and a second resonant peak which substantially overlaps the second absorption peak; and applying the enhanced light having the first and second resonant peaks to the color converting medium, whereby the light at the first and second resonant peaks is absorbed by the color converting medium and emitted at a third wavelength different than the first and second wavelengths.

8. A method as claimed in claim 7 wherein the step of enhancing the broad spectrum light includes providing a microcavity structure having a resonance such that the broad spectrum light is enhanced by the microcavity structure to light having the first and second resonant peaks which substantially overlap the first and second absorption peaks.

9. A method as claimed in claim 8 wherein the step of providing the organic electroluminescent device includes providing the device constructed to emit light in a blue-green spectrum.

10. A method as claimed in claim 9 wherein the step of providing the color converting medium includes providing the color converting medium constructed with the first absorption peak substantially in a blue spectrum and the second absorption peak substantially in a green spectrum.

11. A method as claimed in claim 10 wherein the step of providing the color converting medium includes providing the color converting medium constructed with the light emitting wavelength substantially at a red spectrum.

12. A method as claimed in claim 8 wherein the step of providing the microcavity structure includes providing the microcavity structure with the resonance tuned near the first and second absorption peaks of the color converting medium.

* * * * *